(12) United States Patent
Yamano

(10) Patent No.: US 7,884,453 B2
(45) Date of Patent: Feb. 8, 2011

(54) SEMICONDUCTOR DEVICE AND MANUFACTURING METHOD THEREOF

(75) Inventor: Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 406 days.

(21) Appl. No.: 11/856,354

(22) Filed: Sep. 17, 2007

(65) Prior Publication Data

US 2008/0073798 A1 Mar. 27, 2008

(30) Foreign Application Priority Data

Sep. 26, 2006 (JP) ............... 2006-260949

(51) Int. Cl.
*H01L 23/34* (2006.01)
(52) U.S. Cl. .............. 257/667; 257/778; 257/782; 257/E23.125; 257/E23.135
(58) Field of Classification Search .......... 257/667, 257/778, E23.125, E23.135, 782
See application file for complete search history.

(56) References Cited

U.S. PATENT DOCUMENTS 6,518,090 B2 * 2/2003 Dotta et al. ............... 438/106

2005/0142691 A1 6/2005 Shibata

FOREIGN PATENT DOCUMENTS

| CN | 1835654 A | 9/2006 |
|---|---|---|
| JP | 01-276750 | 11/1989 |
| JP | 09-064049 | 3/1997 |
| JP | 9-162348 | 6/1997 |
| JP | 2000-164638 | 6/2000 |
| JP | 2001-298115 | 10/2001 |

* cited by examiner

*Primary Examiner*—Evan Pert
*Assistant Examiner*—Krista Soderholm
(74) *Attorney, Agent, or Firm*—Rankin, Hill & Clark LLP

(57) ABSTRACT

The present invention relates to a semiconductor device including a semiconductor chip encapsulated by an encapsulation resin and a manufacturing method thereof, and an object of the invention is to provide the semiconductor chip and its manufacturing method in which the reduction in size may be attempted. It includes a semiconductor chip 15, an external connection terminal pad 18 electrically connected to the semiconductor chip 15, and an encapsulation resin 16 encapsulating the semiconductor chip 15, wherein a wiring pattern 12 on which the external connection terminal pad 18 is formed is provided between the semiconductor chip 15 and the external connection terminal pad 18, and the semiconductor chip 15 is flip-chip bonded to the wiring pattern 12.

6 Claims, 23 Drawing Sheets

SEMICONDUCTOR DEVICE AND MANUFACTURING METHOD THEREOF

BACKGROUND OF THE INVENTION

The present invention relates to a semiconductor device and a manufacturing method thereof, and more particularly, to a semiconductor device including a semiconductor chip encapsulated by an encapsulation resin and a manufacturing method thereof.

Among those conventional semiconductor devices, there is a type of semiconductor device from which a core substrate is eliminated for the purpose of miniaturization (see FIG. 1, for example).

FIG. 1 is a cross-sectional view of a conventional semiconductor device. In FIG. 1, "J" represents a thickness of an encapsulation resin 103 formed over a semiconductor chip 10 (herein after referred to as "thickness J").

With reference to FIG. 1, a conventional semiconductor device 100 includes a chip fixing resin 101, a semiconductor chip 102, an encapsulation resin 103, external connection terminals 104 and Au wires 105.

The chip fixing resin 101 is a resin for fixing the semiconductor chip 102 on a later-described metal plate 110 (see FIG. 5). A bottom surface 101A of the chip fixing resin 101 is approximately flush with a bottom surface 103A of the encapsulation resin 103.

The semiconductor chip 102 is fixed on the chip fixing resin 101 with its face up. The semiconductor chip 102 has electrode pads 107. The electrode pads 107 are connected to the external connection terminals 104 via the Au wires 105. That is, the semiconductor chip 102 is wire-bonded to the external connection terminals 104.

The encapsulation resin 103 is provided so as to encapsulate the semiconductor chip 102 and the Au wires 105. The encapsulation resin 103 has raised portions 108 which protrude from the bottom surface 103A of the encapsulation resin 103.

The external connection terminals 104 are provided so as to cover the raised portions 108. The external connection terminals 104 are electrically connected to the semiconductor chip 102 via the Au wires 105.

FIGS. 2 through 6 are views showing manufacturing steps of a conventional semiconductor device. In FIGS. 2 through 6, any constituents identical to those in the semiconductor device 100 shown in FIG. 1 are indicated with identical reference numerals.

With reference to FIGS. 2 through 6, a manufacturing method of the conventional semiconductor device 100 will be explained. In a process step shown in FIG. 2, concave portions 111 are formed on the metal plate 110. Next, in a process step shown in FIG. 3, a resist film 113 having openings 113A, exposing only the concave portions 111, is formed over the metal plate 110, and thereafter, plated films are deposited on the metal plate 110 in the regions corresponding to the concave portions 111 by an electrolytic plating method to form the external connection terminals 104. In a subsequent process step shown in FIG. 4, the resist film 113 is eliminated.

Next, in a process step shown in FIG. 5, the semiconductor chip 102 is fixed, with its face up, to the metal plate 110 via the chip fixing resin 101, and thereafter, the electrode pads 107 and the external connection terminals 104 are connected (wire-bonded) via the Au wires 105.

Next, in a process step shown in FIG. 6, the encapsulation resin 103 encapsulating the semiconductor chip 102 and the Au wires 105 is formed over the metal plate 110. Thereafter, by eliminating the metal plate 110, the semiconductor device 100 as shown in FIG. 1 is completed (see Patent Document 1, for example). [Patent Document 1] JP-A-9-162348

However, since, in the conventional semiconductor device 100, the semiconductor chip 102 and the external connection terminals 104 are wire-bonded, portions of Au wires 105 are placed above the semiconductor chip 12, and in order to encapsulate these portions of the Au wires 105, the thickness J of the encapsulation resin 103 formed over the semiconductor chip 102 had to be large (specifically, at least 150 um). This caused the semiconductor device 100 to be thick, so that there has been a problem that it is difficult to attempt the miniaturization of the semiconductor device 100.

SUMMARY OF THE INVENTION

Accordingly, the present invention is made in the light of the above-mentioned problem, and an object of which is to provide a semiconductor device and a manufacturing method that allow the miniaturization.

According to a first aspect of the invention, there is provided with a semiconductor device including:

a semiconductor chip, an external connection terminal pad electrically connected to the semiconductor chip, an encapsulation resin for encapsulating the semiconductor chip, and a wiring pattern, on which the external connection terminal pad is placed, provided between the semiconductor chip and the external connection terminal pad, wherein the semiconductor chip is flip-chip bonded to a portion of the wiring pattern which faces to the semiconductor chip.

According to the invention, by placing the wiring pattern, to which the external connection terminal pad is disposed, between the semiconductor chip and the external connection terminal pad, and by flip-chip bonding the semiconductor chip to a portion of the wiring pattern facing to the semiconductor chip, it is possible to reduce the thickness of the encapsulation resin placed above the semiconductor chip, thus the miniaturization of the semiconductor device (specifically, reduction of a size in the thickness direction of the semiconductor device) may be attempted.

According to a second aspect of the invention, there is provided with a manufacturing method of a semiconductor device including a semiconductor chip having an internal connection terminal provided thereon, an external connection terminal pad electrically connected to the semiconductor chip, an encapsulation resin encapsulating the semiconductor chip, and a wiring pattern provided between the semiconductor chip and the external connection terminal pad and electrically connected to the semiconductor chip, the method including:

a metal layer lamination process for sequentially laminating a first metal layer and a second metal layer on a metal plate which constitutes a support plate, a wiring pattern formation process for etching the second metal layer to form the wiring pattern, an anisotropic conductive resin formation process for forming an anisotropic conductive resin on the first metal layer so as to cover the wiring pattern, and a semiconductor chip bonding process for pressing the semiconductor chip against the anisotropic conductive resin to press-bond the internal connection terminal and the wiring pattern so as to flip-chip bond the semiconductor chip to the wiring pattern.

Further, according to a third aspect of the invention, there is provided with a manufacturing method of a semiconductor device including a semiconductor chip having an internal connection terminal provided thereon, an external connection terminal pad electrically connected to the semiconductor chip, an encapsulation resin encapsulating the semiconductor chip, and a wiring pattern provided between the semiconductor chip and the external connection terminal pad and electrically connected to the semiconductor chip, the method including:

a metal layer lamination process for sequentially laminating a first metal layer, a second metal layer and a third metal layer on a metal plate which constitutes a support plate, a wiring pattern formation process for etching the third metal layer to form the wiring pattern, an anisotropic conductive resin formation process for forming an anisotropic conductive resin on the first metal layer so as to cover the wiring pattern, and a semiconductor chip bonding process for pressing the semiconductor chip against the anisotropic conductive resin to press-bond the internal connection terminal and the wiring pattern so as to flip-chip bond the semiconductor chip to the wiring pattern.

According to the invention, after forming the anisotropic conductive resin over the first metal layer so as to cover the wiring pattern, by pressing the semiconductor chip against the anisotropic conductive resin to press-bond the internal connection terminal and the wiring pattern so as to flip-chip bond the semiconductor chip to the wiring pattern, it is possible to reduce the thickness of the encapsulation resin placed above the semiconductor chip, thus the miniaturization of the semiconductor device (specifically, reduction of a size in the thickness direction of the semiconductor device) may be attempted.

Furthermore, by using the anisotropic conductive resin, the pressure to press the semiconductor chip may be smaller compared to a case where a typical insulating resin is used, so that the semiconductor device may more easily be manufactured.

According to a forth aspect of the invention, there is provided with a manufacturing method of a semiconductor device including a semiconductor chip having an internal connection terminal provided thereon, an external connection terminal pad electrically connected to the semiconductor chip, an encapsulation resin encapsulating the semiconductor chip, and a wiring pattern provided between the semiconductor chip and the external connection terminal pad and electrically connected to the semiconductor chip, the method including:

a metal layer formation process for sequentially laminating a first metal layer and a second metal layer on a metal plate which constitutes a support plate, a wiring pattern formation process for etching the second metal layer to form the wiring pattern, an insulating resin formation process for forming an insulating resin on the first metal layer so as to cover the wiring pattern, and a semiconductor chip bonding process for pressing the semiconductor chip against the insulating resin to press-bond the internal connection terminal and the wiring pattern so as to flip-chip bond the semiconductor chip to the wiring pattern.

Further, according to a fifth aspect of the invention, there is provided with a manufacturing method of a semiconductor device including a semiconductor chip having an internal connection terminal provided thereon, an external connection terminal pad electrically connected to the semiconductor chip, an encapsulation resin encapsulating the semiconductor chip, and a wiring pattern provided between the semiconductor chip and the external connection terminal pad and electrically connected to the semiconductor chip, the method including:

a metal layer formation process for sequentially laminating a first metal layer, a second metal layer and a third metal layer on a metal plate which constitutes a support plate, a wiring pattern formation process for etching the third metal layer to form the wiring pattern, an insulating resin formation process for forming an insulating resin on the first metal layer so as to cover the wiring pattern, and a semiconductor chip bonding process for pressing the semiconductor chip against the insulating resin to press-bond the internal connection terminal and the wiring pattern so as to flip-chip bond the semiconductor chip to the wiring pattern.

According to the invention, after forming the insulating resin over the first metal layer so as to cover the wiring pattern, by pressing the semiconductor chip against the insulating resin to press-bond the internal connection terminal and the wiring pattern so as to flip-chip bond the semiconductor chip to the wiring pattern, it is possible to reduce the thickness of the encapsulation resin placed above the semiconductor chip, thus the miniaturization of the semiconductor device (specifically, reduction of a size in the thickness direction of the semiconductor device) may be attempted.

According to the invention, miniaturization of a semiconductor device may be attempted.

DETAILED DESCRIPTION OF THE PREFERRED EMBODIMENTS

Embodiments of the invention will now be explained with reference to figures.

Embodiment 1

Figure 1:
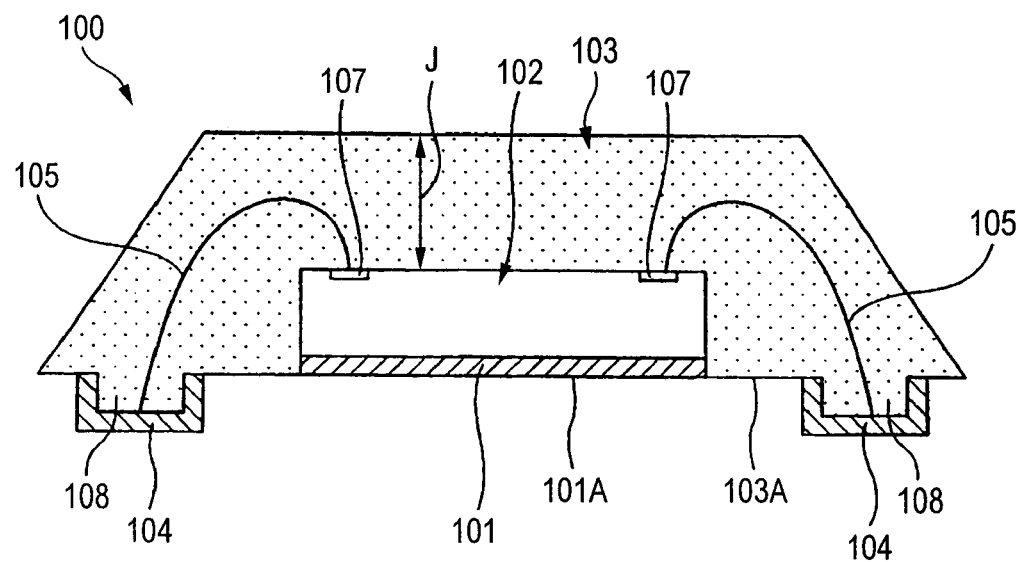
FIG. 1 is a cross-sectional view showing a conventional semiconductor device.
Figure 2:
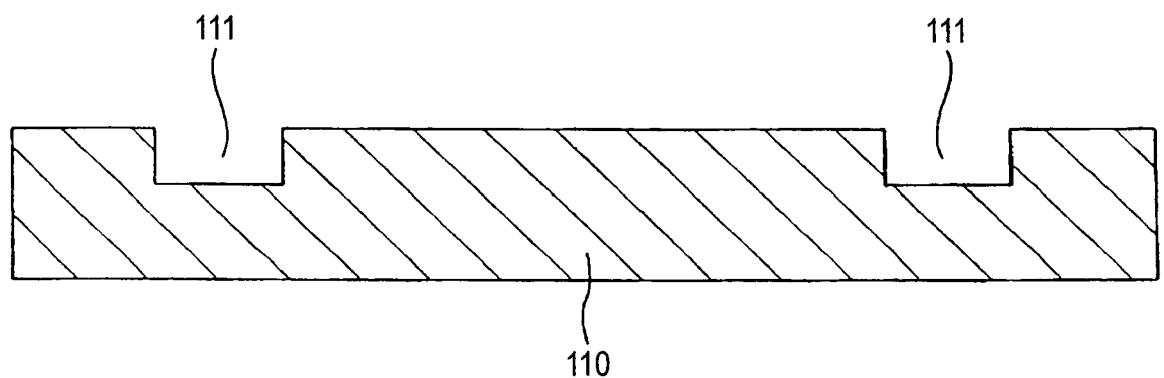
FIG. 2 shows a manufacturing process step (No. 1) of the conventional semiconductor device.
Figure 3:
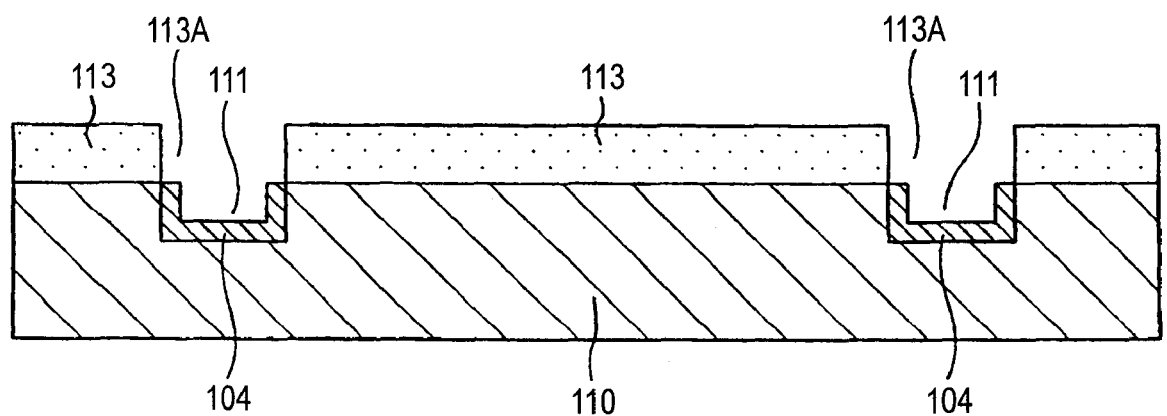
FIG. 3 shows a manufacturing process step (No. 2) of the conventional semiconductor device.
Figure 4:
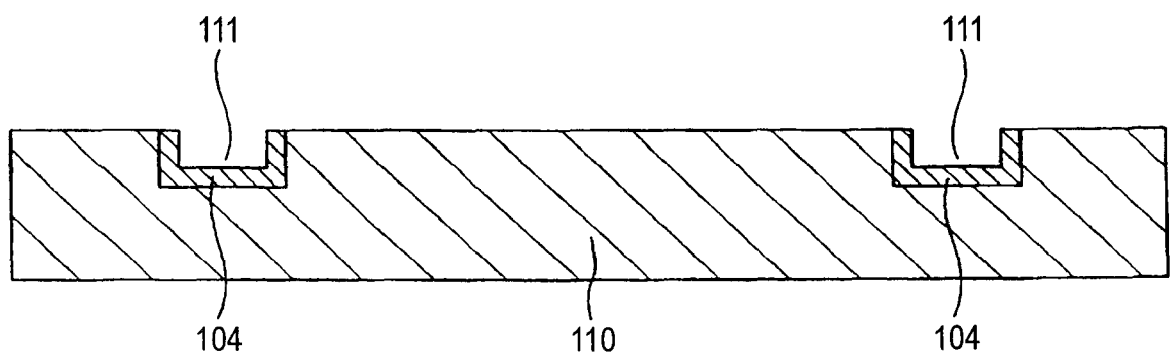
FIG. 4 shows a manufacturing process step (No. 3) of the conventional semiconductor device.
Figure 5:
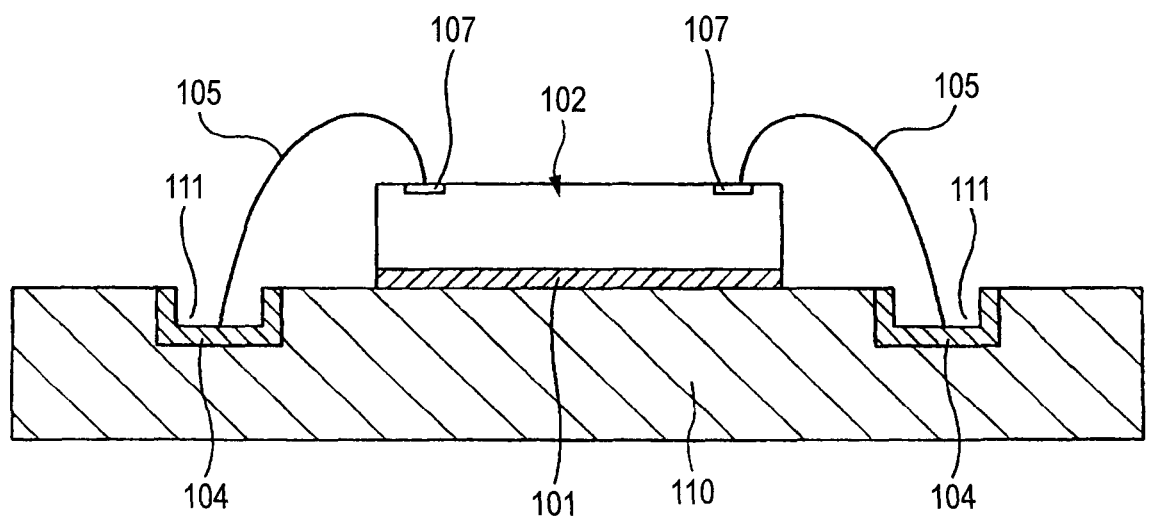
FIG. 5 shows a manufacturing process step (No. 4) of the conventional semiconductor device.
Figure 6:
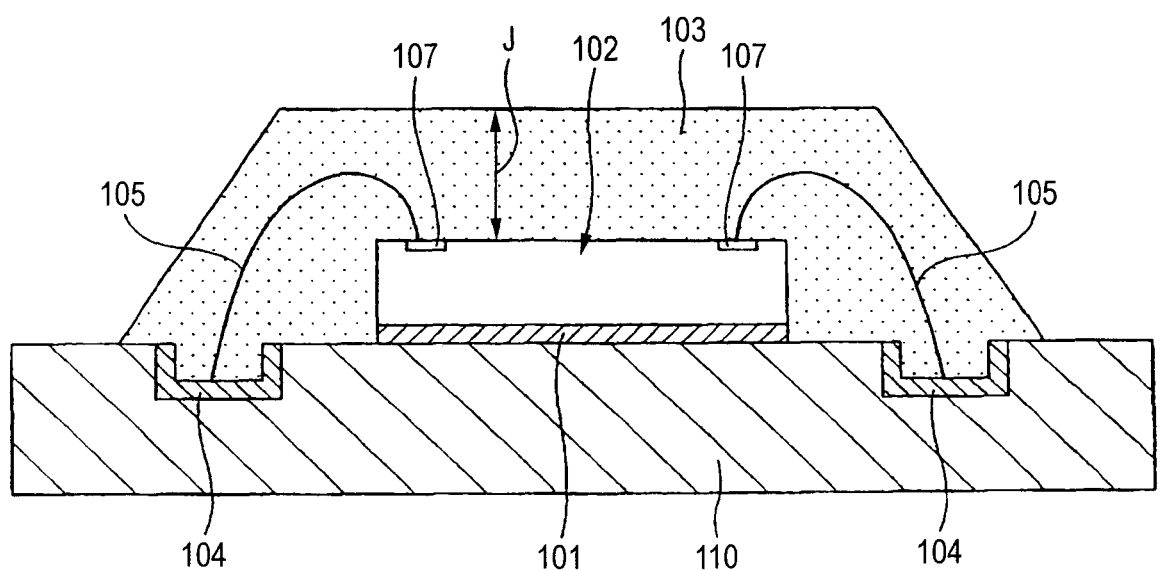
FIG. 6 shows a manufacturing process step (No. 5) of the conventional semiconductor device.
Figure 7:
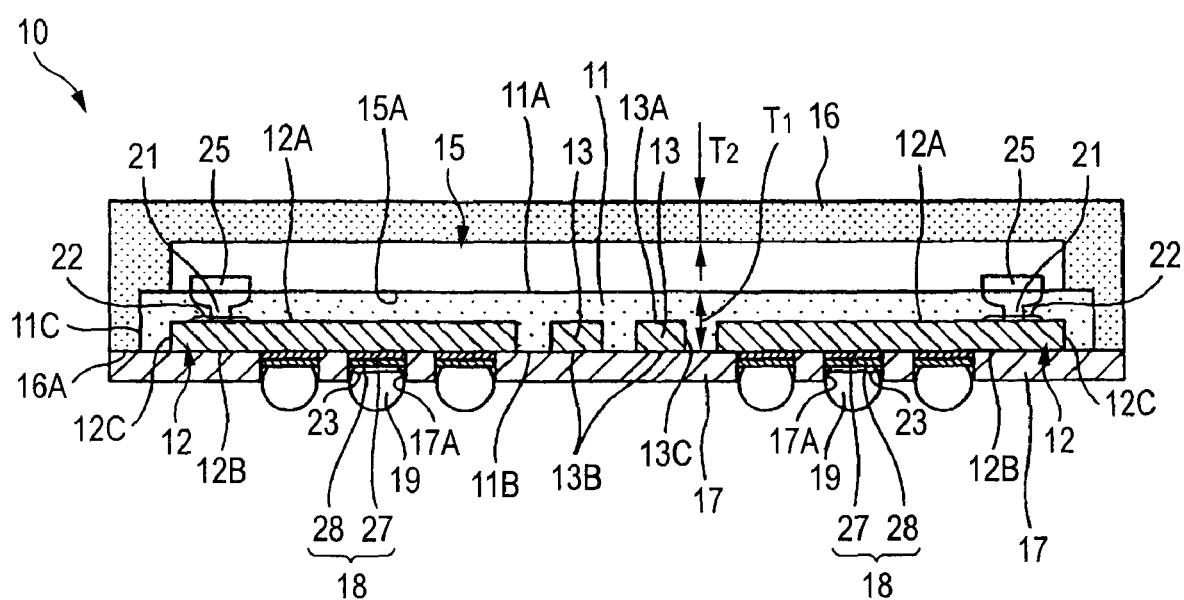
FIG. 7 is a cross-sectional view of a semiconductor device according to a first embodiment of the invention.

FIG. 7 is a cross-sectional view of a semiconductor device according to a first embodiment of the invention.

With reference to FIG. 7, the semiconductor device 10 according to the first embodiment of the invention includes an insulating resin 11, wiring patterns 12, 13, a semiconductor chip 15, an encapsulation resin 16, a solder mask 17, external connection terminal pads 18, external connection terminals 19, and internal connection terminals 21.

The insulating resin 11 is provided so as to cover top surfaces 12A, 13A and side surfaces 12C, 13C of the wiring patterns 12, 13. The insulating resin 11, while in a semi-cured state, has a function as an adhesive. As for the insulating resin 11, an adhesive sheet-type insulating resin (i.e. NCF (Non Conductive Film)), a paste-type insulating resin (i.e. NCP (Non Conductive Paste)), or a buildup insulating resin used when forming buildup layers may for example be used. The thickness $T_1$ of the insulating resin 11 may for example be 20 um.

The wiring patterns 12, 13 are provided on the insulating resin 11. The top surfaces 12A, 13A and the side surfaces 12C, 13C of the wiring patterns 12, 13 are covered by the insulating resin 11. Bottom surfaces 12B, 13B of the wiring patterns 12, 13 are exposed from the insulating resin 11. Bottom surfaces 12B, 13B of the wiring patterns 12, 13 are approximately flush with a bottom surface 11B of the insulating resin 11. The wiring pattern 12 has chip connection regions 22 to which the internal connection terminals 21 are connected, and pad formation regions 23 on which the external connection pads 18 are formed. The chip connection regions 22 are disposed on the top surfaces 12A of the wiring pattern 12. The pad formation regions 23 are disposed on the bottom surfaces 12B of the pattern 12. As for a material of the wiring patterns 12, 13, Cu may for example be used. The thickness of the wiring patterns 12, 13 may for example be 10 um.

By providing such the wiring pattern 12, the forming positions of the external connection terminal pads 18 may be adjusted correspondingly to the positions of pads on a mounting board (not shown) to which the semiconductor device 10 is to be connected.

The semiconductor chip 15 has electrode pads 25. The semiconductor chip 15 is disposed on the insulating resin 11 so as to have a surface 15A of the semiconductor chip 15 on which the electrode pads 25 are provided come into contact with the top surface 11A of the insulating resin 11. The electrode pads 25 are electrically connected to the wiring pattern 12 via the internal connection terminals 21. That is, the semiconductor chip 15 is being flip-chip bonded to the wiring pattern 12. The semiconductor chip 15 is covered by the encapsulation resin 16.

In this way, by flip-chip bonding the semiconductor chip 15 to the wiring pattern 12, there would be no longer wires of wire-bonding connections present above the semiconductor chip 15, and the thickness $T_2$ of the encapsulation resin 16 formed over the semiconductor chip 15 may be reduced, thus miniaturization of the semiconductor device (specifically, reduction of a size in the thickness direction of the semiconductor device) may be realized. The thickness $T_2$ of the encapsulation resin 16 formed over the semiconductor chip 15 may for example be 30 um to 60 um.

The encapsulation resin 16 is provided so as to cover the top surface 11A and side surfaces 11C of the insulating resin 11 and the semiconductor chip 15. A bottom surface 16A of the encapsulation resin 16 is approximately flush with the bottom surface 11B of the insulating resin 11. The encapsulation resin 16 is a resin for protecting the semiconductor chip 15 from external impacts and the like. The encapsulation resin 16 may for example be formed by a transfer molding method using a metal mold. As for the encapsulation resin 16, an epoxy resin may for example be used.

The solder mask 17 is provided to cover the bottom surface 11B of the insulating resin 11, the bottom surfaces 12B of the wiring pattern 12 except for the pad formation regions 23, the bottom surfaces 13B of the wiring pattern 13 and the bottom surface 16A of the encapsulation resin 16. The solder mask 17 is a mask for protecting the wiring patterns 12, 13.

The external connection terminal pads 18 include an Ni film 27 and an Au film 28. The Ni film 27 is provided in the pad formation regions 23. The Au film 28 is provided under the Ni film 27.

The external connection terminals 19 are provided on the bottom surface of the Au film 28 which is a constituent of the external connection terminal pads 18. The external connection terminals 19 are terminals for connecting the semiconductor device 10 to a mounting board (not shown) such as a motherboard. As for the external connection terminals 19, for example, solder bumps may be used.

The internal connection terminals 21 are provided in the insulating resin 11. The internal connection terminals 21 are connected to the electrode pads 25 at their one ends, and to the portions of the wiring pattern 12 corresponding to the chip connection regions 22 at the other ends. As for the internal connection terminals 21, for example, Au stud bumps, an Au plated film, or a metal film including an Ni film formed by nonelectrolytic plating and an Au film covering the Ni film may be used.

According to the semiconductor device of the present embodiment, by providing, between the semiconductor chip 15 and the external connection terminal pads 18, the wiring pattern 12 on which the external connection terminal pads 18 are placed, and by flip-chip bonding the semiconductor chip 15 to the wiring pattern 12, the thickness $T_2$ of the encapsulation resin 16 formed above the semiconductor chip 15 may be reduced, thus miniaturization of the semiconductor device (specifically, reduction of a size in the thickness direction of the semiconductor device) may be attempted.

FIGS. 8 through 18 are views showing manufacturing steps of the semiconductor device according to the first embodiment of the invention. In FIGS. 8 through 18, any constituents identical to those in the semiconductor device 10 of the first embodiment shown in FIG. 7 are indicated with identical reference numerals.

Figure 8:
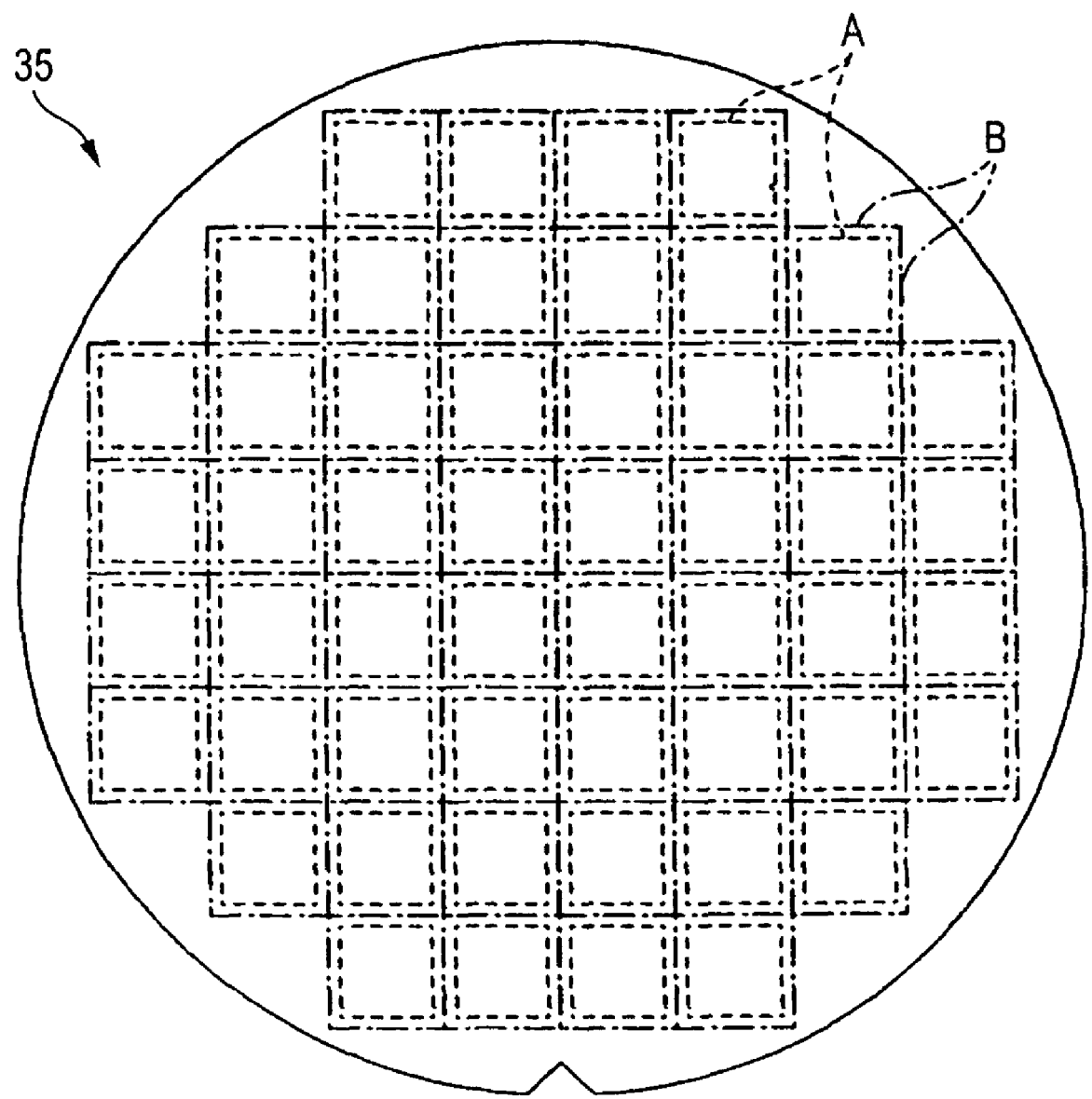
FIG. 8 shows a manufacturing process step (No. 1) of the semiconductor device according to the first embodiment of the invention.

With reference to FIGS. 8 through 18, a manufacturing method of a semiconductor device according to the first embodiment of the invention will be explained. First, in a process step shown in FIG. 8, a metal plate 35 to act as a support plate is provided. The metal plate 35 has a circular shape when view in a plan view. The metal plate 35 has a plurality of semiconductor formation regions A on which the semiconductor devices 10 are formed. As for the metal plate 35, a Cu foil may for example be used. The thickness of the metal plate 35 may for example be 100 um. In FIG. 8, "B" indicates positions on the encapsulation resin 16 cut by a dicer (hereinafter referred to as "cutting positions B").

Besides, the metal plate 35 may have a rectangular shape instead of a circular shape.

Figure 9:
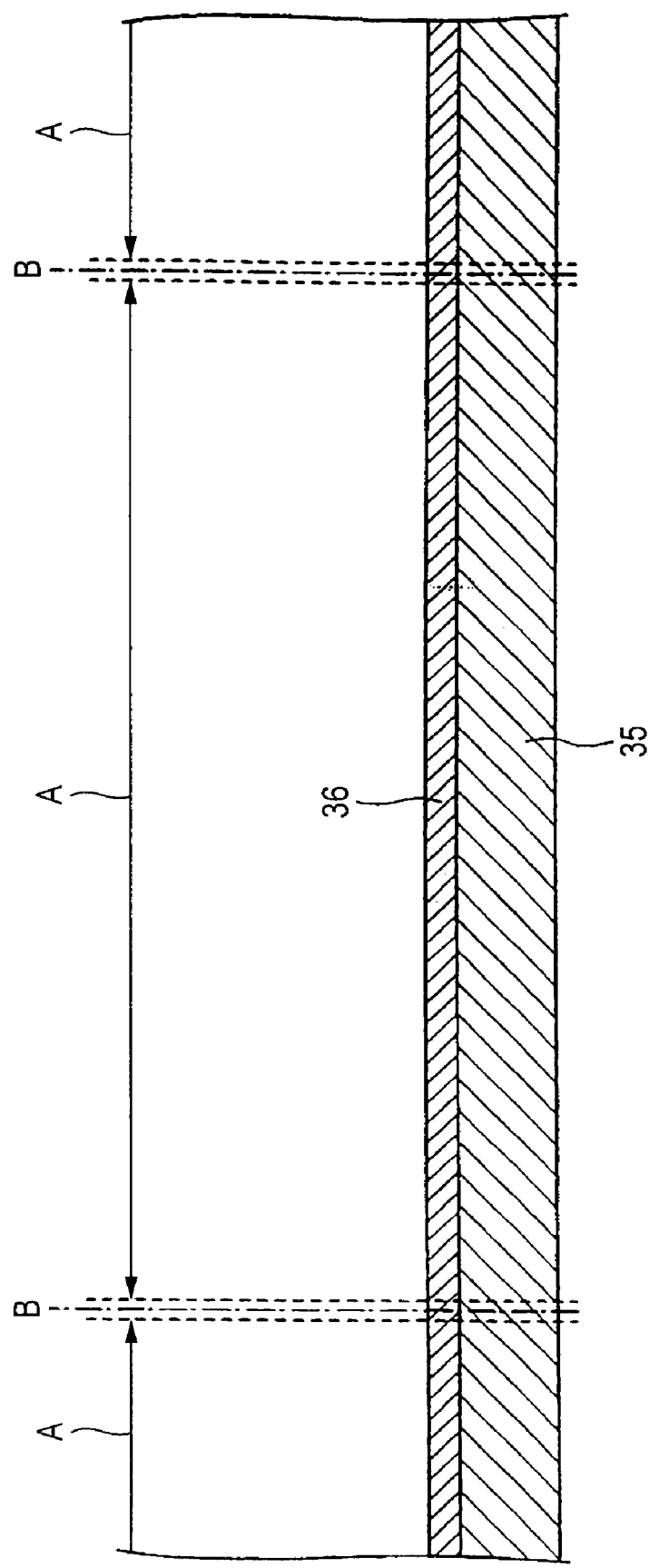
FIG. 9 shows a manufacturing process step (No. 2) of the semiconductor device according to the first embodiment of the invention.

Next, in a process step shown in FIG. 9, a metal layer 36 is formed so as to cover the metal plate 35. As for the metal layer 36, a Cu foil may for example be used. The thickness of the metal layer 36 may for example be 10 um.

Figure 10:
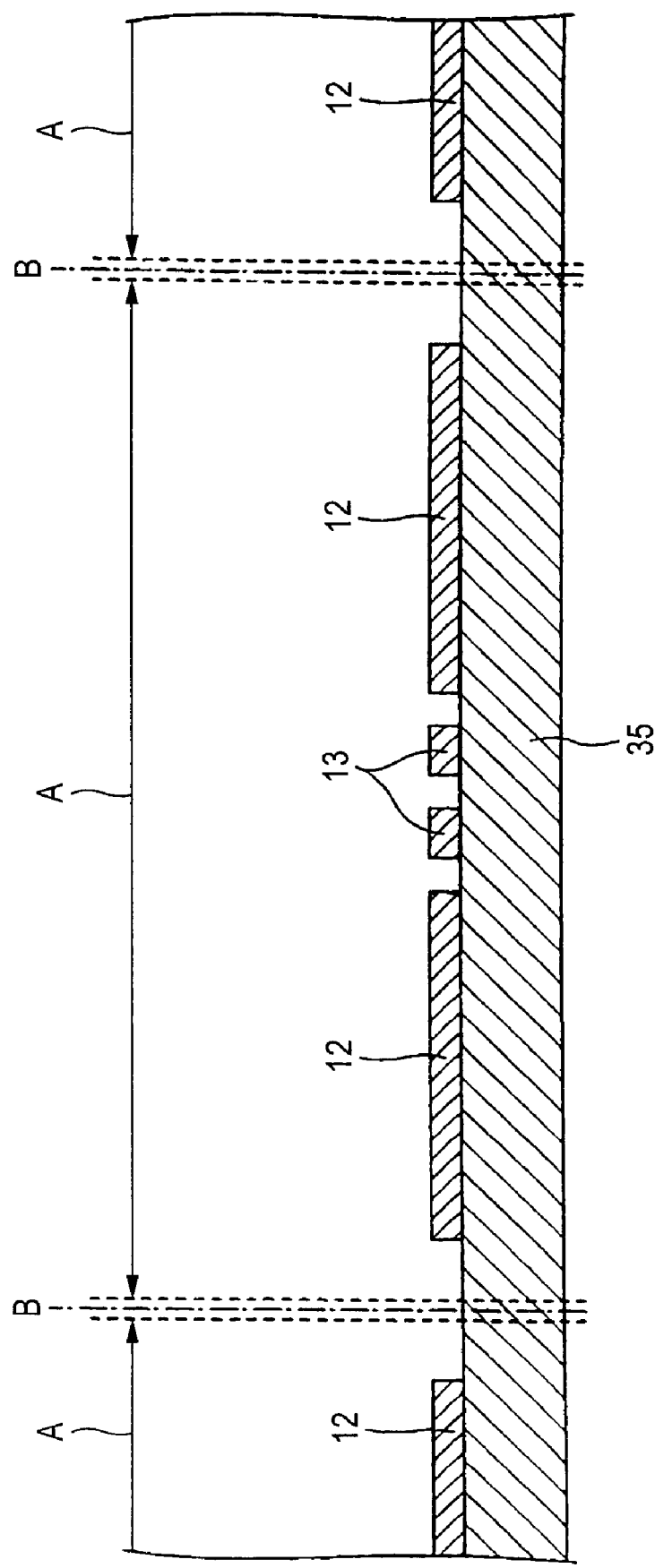
FIG. 10 shows a manufacturing process step (No. 3) of the semiconductor device according to the first embodiment of the invention.

Next, in a process step shown in FIG. 10, the metal layer 36 is patterned to form the wiring patterns 12, 13 corresponding to the semiconductor device formation regions A over the metal plate 35 (wiring pattern formation process). More specifically, a patterned resist film is formed over the metal layer 36 shown in FIG. 9, and thereafter, the metal layer 36 is etched to form the wiring patterns 12, 13 by anisotropic etching using this resist film as a mask.

Figure 11:
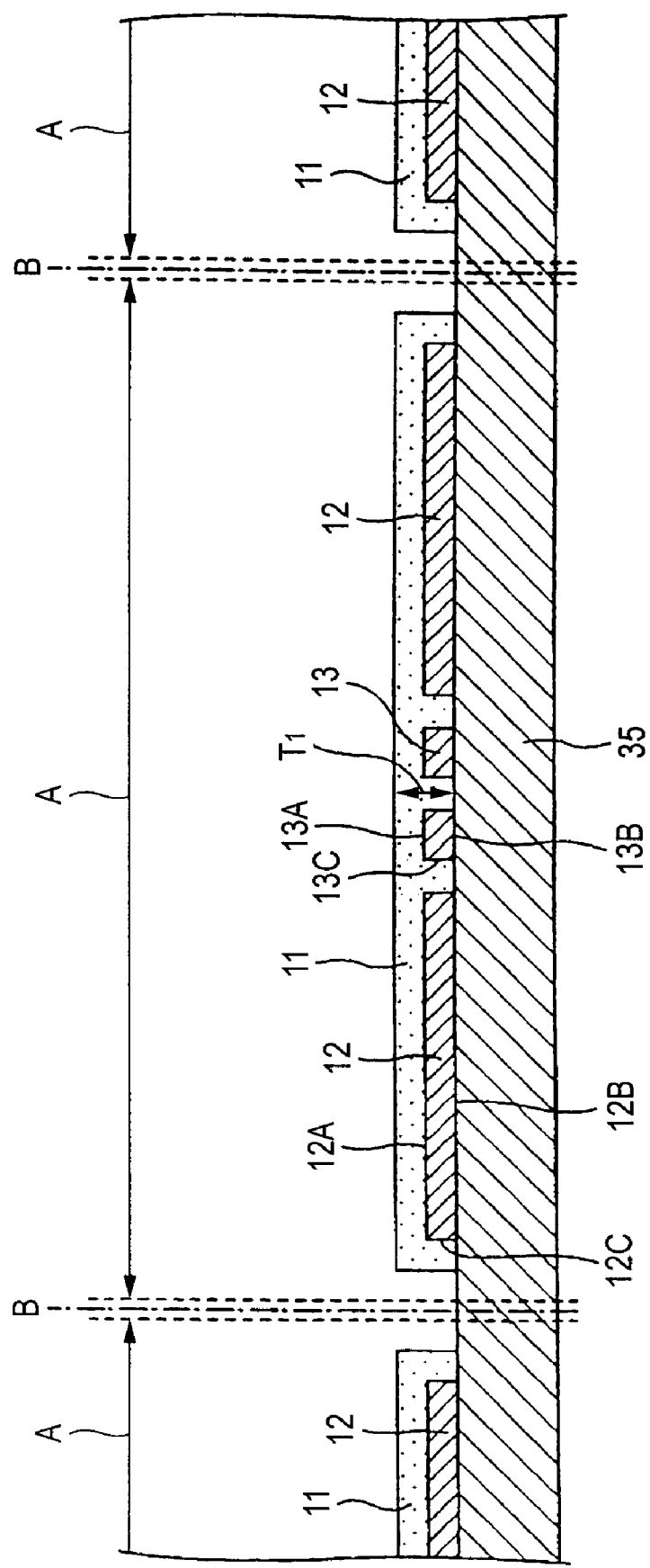
FIG. 11 shows a manufacturing process step (No. 4) of the semiconductor device according to the first embodiment of the invention.

Next, in a process step shown in FIG. 11, an insulating resin 11 is formed so as to cover top surfaces 12A, 13A and side surfaces 12C, 13C of the wiring patterns 12, 13 formed on the metal plate 35. As for the insulating resin 11, an adhesive sheet-type insulating resin (i.e. NCF (Non Conductive Film)), or a paste-type insulating resin (i.e. NCP (Non Conductive Paste)) may for example be used. When the paste-type insulating resin (i.e. NPC (Non Conductive Paste)) is used as the insulating resin 11, the paste-type insulating resin is formed by a printing method, and then the paste-type insulating resin is prebaked to a semi-cured state. This semi-cured insulating resin has a function as an adhesive. The thickness $T_1$ of the insulating resin 11 may for example be 20 um.

Figure 12:
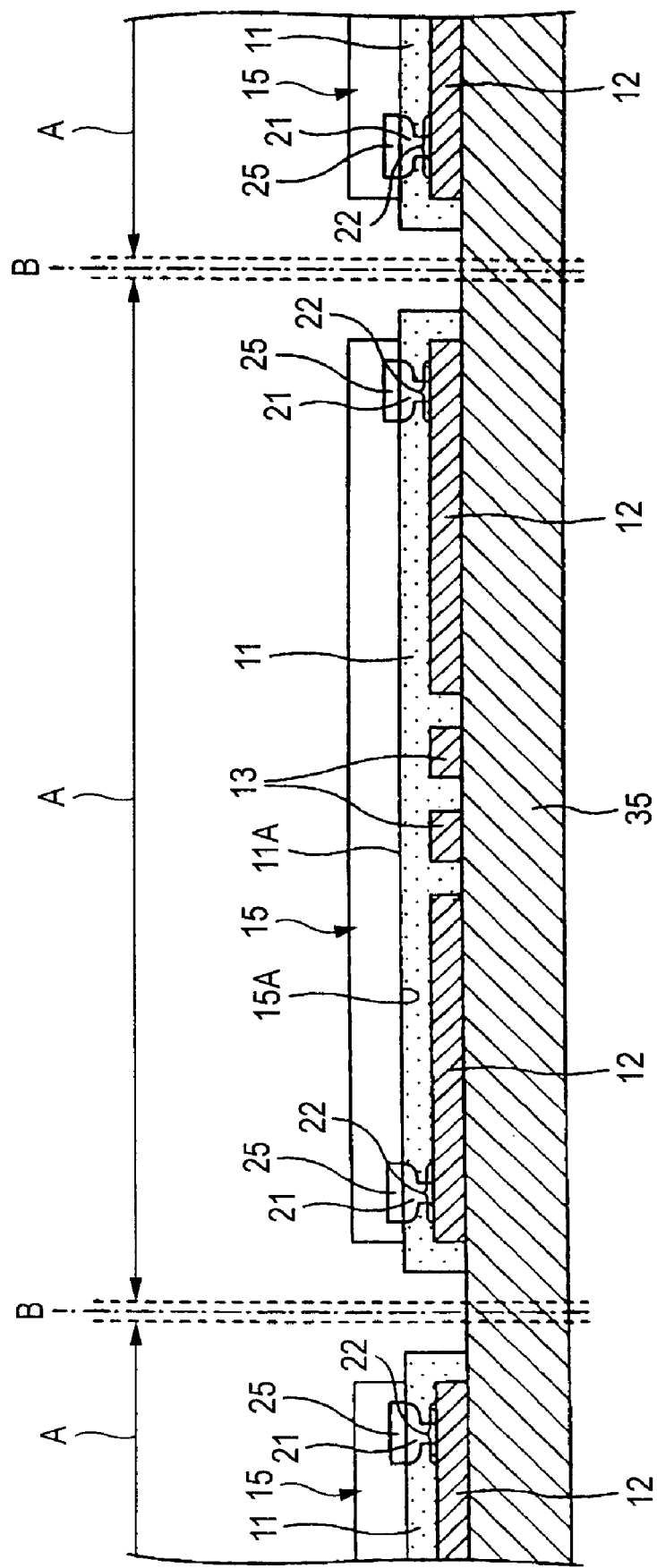
FIG. 12 shows a manufacturing process step (No. 5) of the semiconductor device according to the first embodiment of the invention.

Next, in a process step shown in FIG. 12, a semiconductor chip 5 having electrode pads 25 on which internal connection terminals 21 are formed is provided, and while the structure shown in FIG. 12 is being heated, the semiconductor chip 15 is pressed against the insulating resin 11 to press fit the internal connection terminals 21 into the insulating resin 11, and to pressure-bond the internal connection terminals 21 and the portions of the wiring pattern 12 corresponding to chip connection regions 22, thereby flip-chip connecting the semiconductor chip 15 to the wiring pattern 12 (semiconductor chip connection process). At this point of time, by heating the structure shown in FIG. 12, the insulating resin 11 is cured.

In this way, by flip-chip bonding the semiconductor chip 15 to the wiring pattern 12, there would be no longer wires of wire-bonding connections present above the semiconductor chip 15, the thickness $T_2$ of the encapsulation resin 16 formed above the semiconductor chip 15 may be reduced, thus miniaturization of the semiconductor device (specifically, reduction of a size in the thickness direction of the semiconductor device 10) may be realized.

As for the internal connection terminals 21, for example, Au stud bumps, an Au plated film, or a metal film including an Ni film formed by nonelectrolytic plating and an Au film covering the Ni film, may be used.

Figure 13:
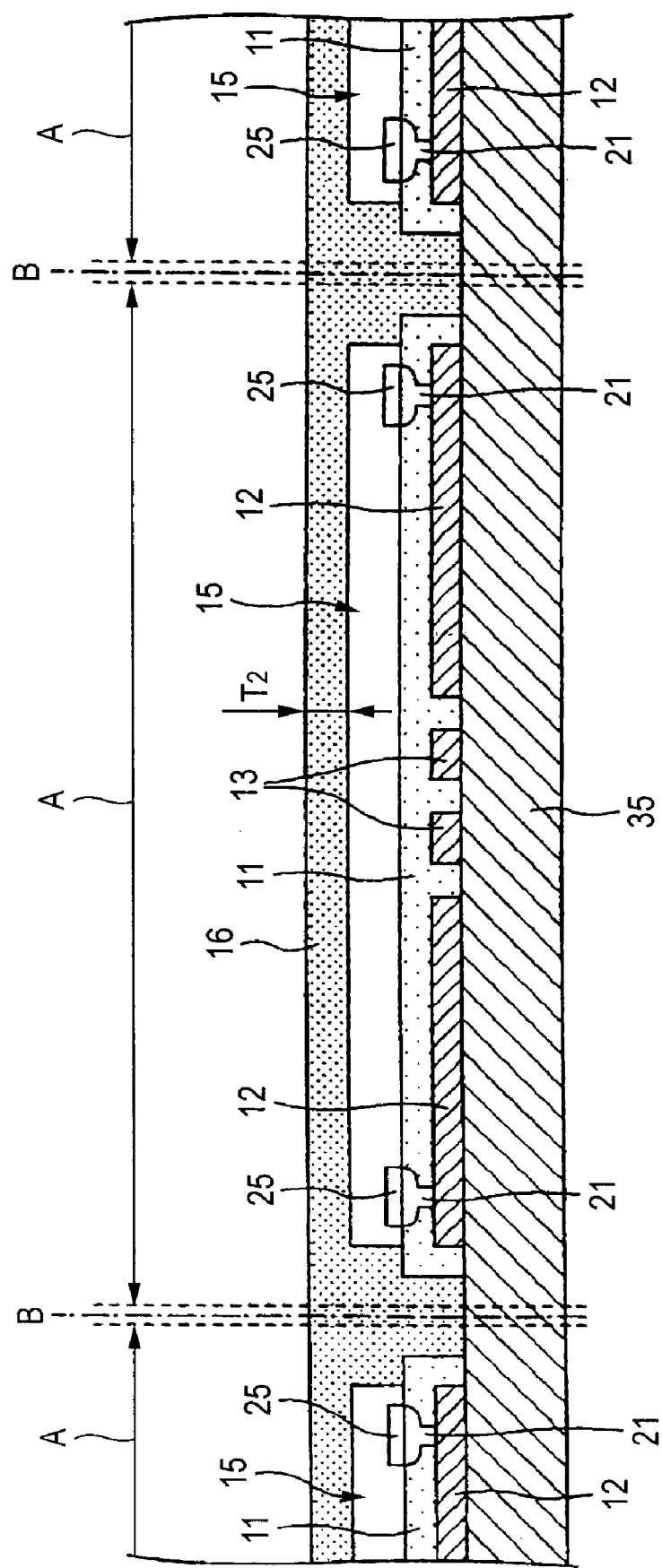
FIG. 13 shows a manufacturing process step (No. 6) of the semiconductor device according to the first embodiment of the invention.

Next, in a process step shown in FIG. 13, an encapsulation resin 16 is formed over the metal plate 35 so as to cover the insulating resin 11 formed in the plurality of semiconductor device formation regions A and the semiconductor chips 15. More specifically, the encapsulation resin 16 is formed by a transfer molding method using a metal mold. As for the encapsulation resin 16, an epoxy resin may for example be used. The thickness $T_2$ of the encapsulation resin 16 formed above the semiconductor chip 15 may for example be 30 um to 60 um.

Figure 14:
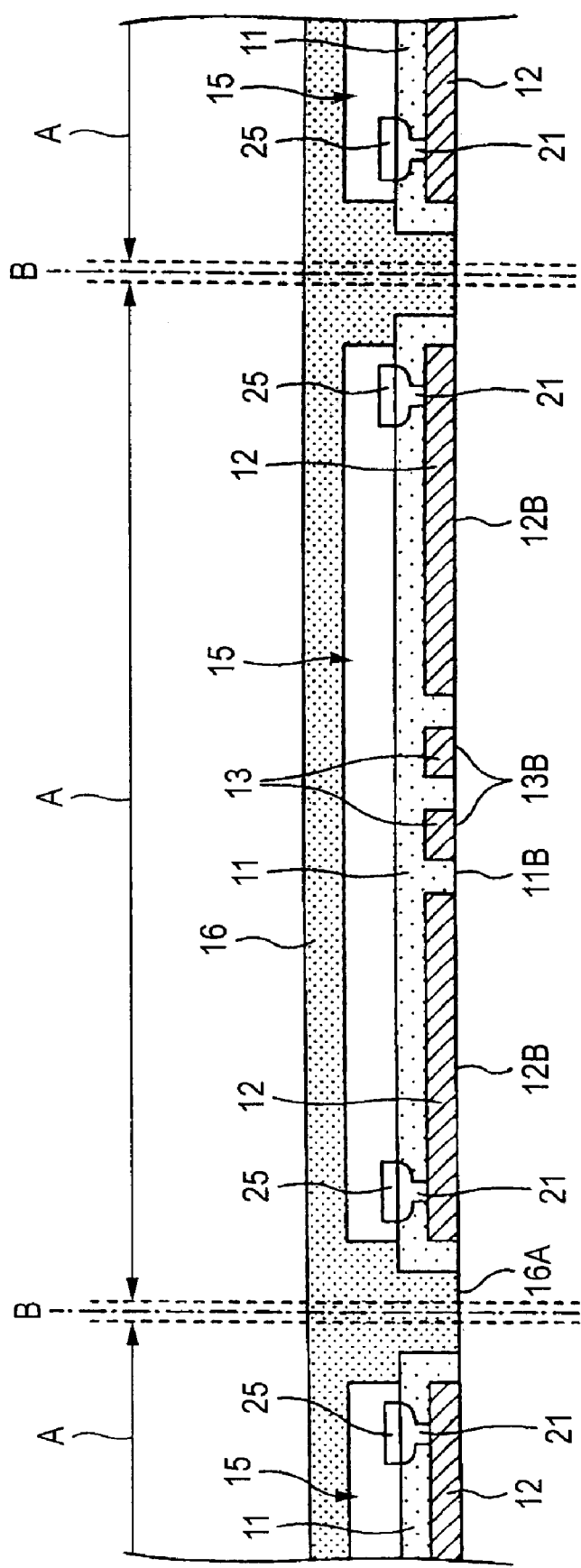
FIG. 14 shows a manufacturing process step (No. 7) of the semiconductor device according to the first embodiment of the invention.

Next, in a process step shown in FIG. 14, the metal plate 35 is eliminated (metal plate elimination process) and thereafter, a roughening treatment is performed on the bottom surfaces 12B, 13B of the wiring patterns 12, 13. More specifically, the metal plate 35 is etched off by i.e. wet etching to eliminate the metal plate 35, and thereafter, the bottom surfaces 12B, 13B of the wiring patterns 12, 13 are roughened either by a black oxide process or a CZ process. The roughening treatment is performed for improving adhesion of the wiring patterns 12, 13 with a solder mask 17 to be formed on the bottom surfaces 12B, 13B of the wiring patterns 12, 13.

Figure 15:
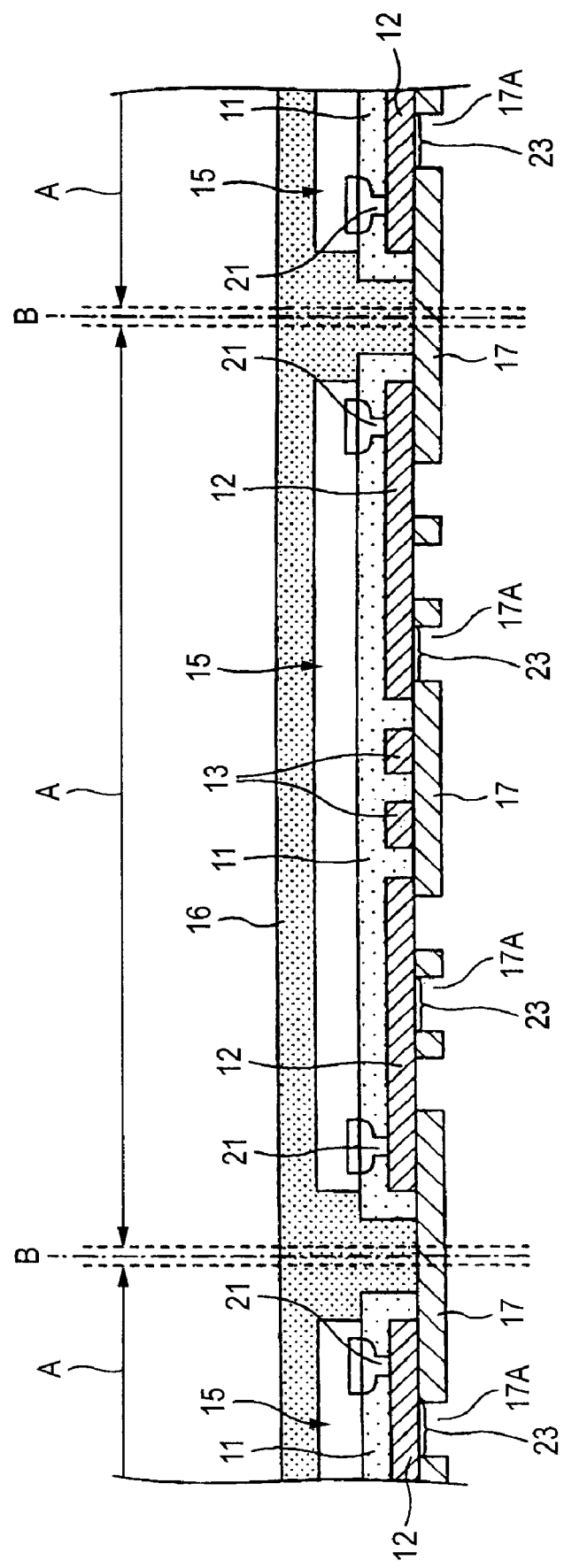
FIG. 15 shows a manufacturing process step (No. 8) of the semiconductor device according to the first embodiment of the invention.

Next, in a process step shown in FIG. 15, the solder mask 17 having openings 17A is formed on the bottom side of the structure shown in FIG. 14. The openings 17A are formed so as to expose portions of the wiring pattern 12 corresponding to pad formation regions 23.

Figure 16:
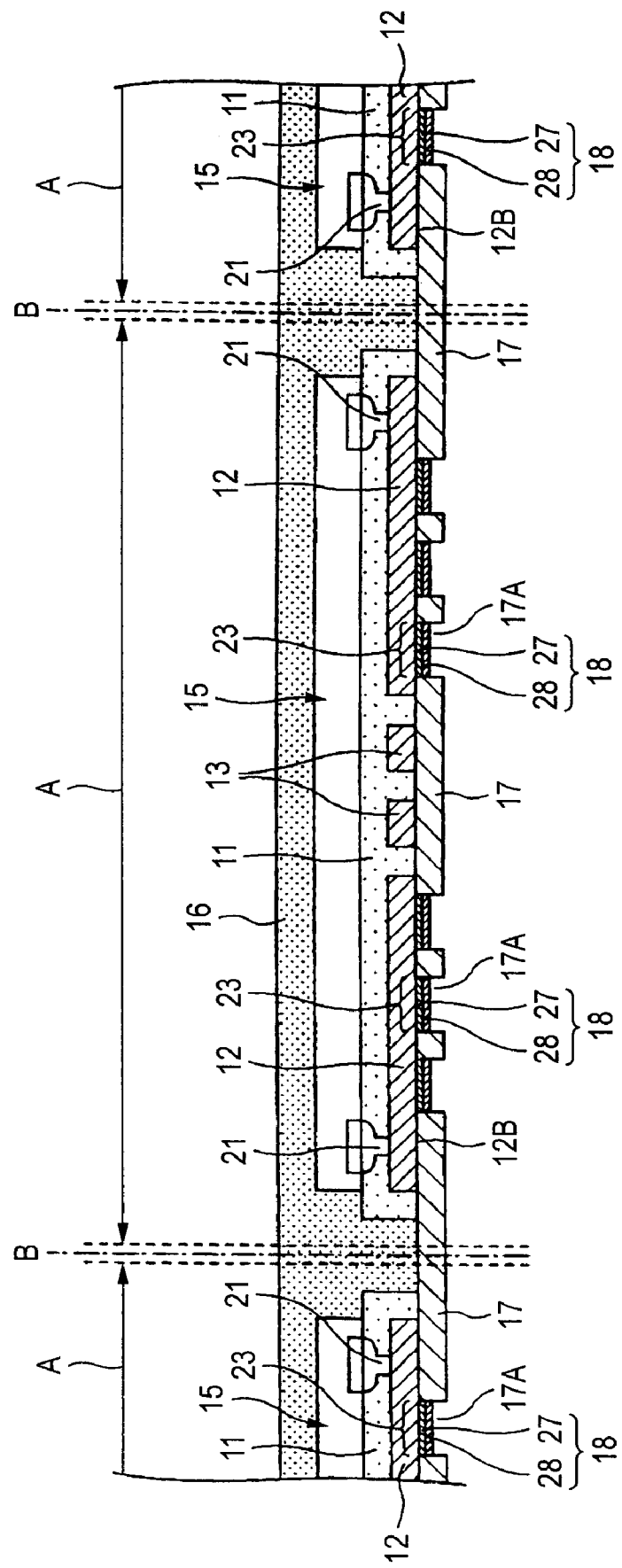
FIG. 16 shows a manufacturing process step (No. 9) of the semiconductor device according to the first embodiment of the invention.

Next, in a process step shown in FIG. 16, over the bottom surface 12B of the wiring pattern 12 at the portions exposed by the openings 17A, an Ni film 27 and an Au film 28 are sequentially deposited though an electrolytic plating method (external connection terminal pad formation process).

Figure 17:
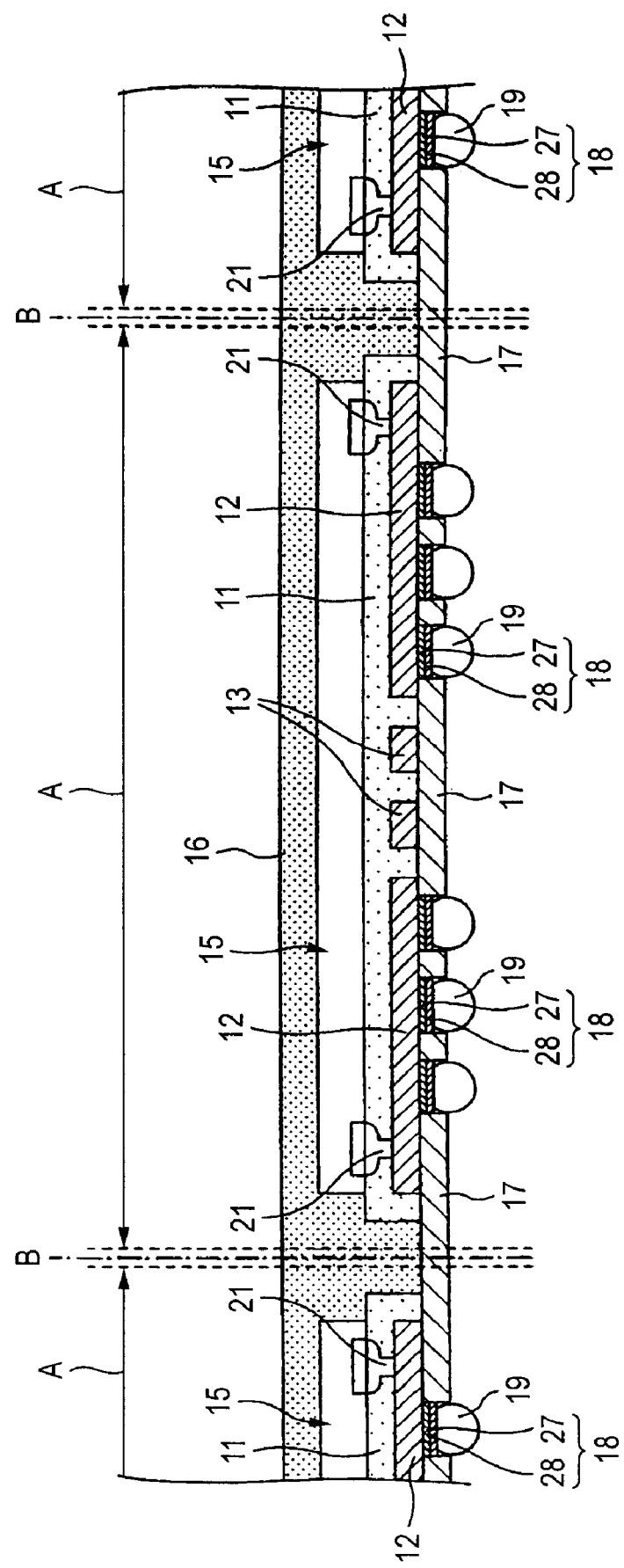
FIG. 17 shows a manufacturing process step (No. 10) of the semiconductor device according to the first embodiment of the invention.
Figure 18:
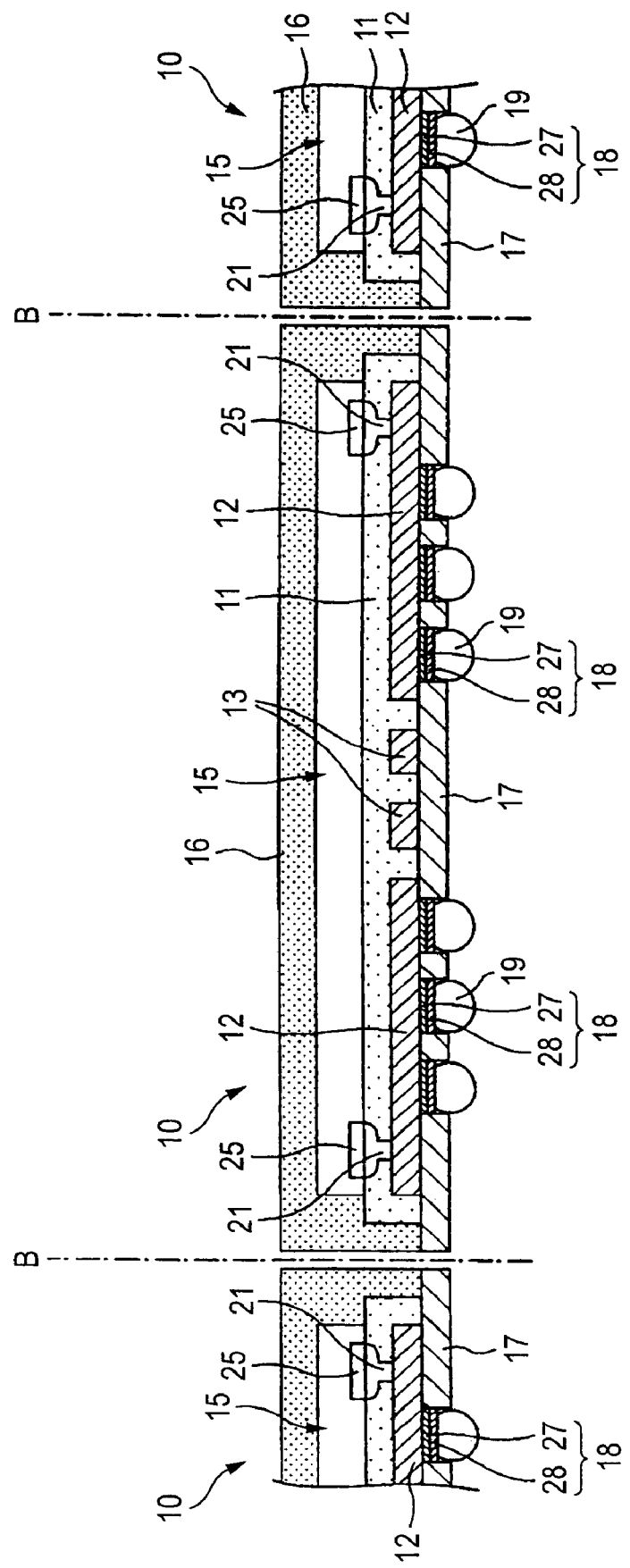
FIG. 18 shows a manufacturing process step (No. 11) of the semiconductor device according to the first embodiment of the invention.

Next, in a process step shown in FIG. 17, over a bottom surface of the Au film 28 which is a constituent of the external connection terminal pads 18, external connection pads 19 are formed. Next, in a process step shown in FIG. 18, by cutting the encapsulation resin 16 and the solder mask 17 by a dicer along the cutting positions B, a plurality of semiconductor devices 10 are completed.

According to the manufacturing method of a semiconductor device of the present embodiment, the insulating resin 11 is formed over the metal plate 35 so as to cover the wiring patterns 12, 13, and thereafter the semiconductor chip is pressed against the insulating resin 11 to press-bond the internal connection terminals 21 and the wiring pattern to flip-chip bond the semiconductor chip 13 to the wiring pattern 12, so that the thickness $T_2$ of the encapsulation resin 16 placed above the semiconductor chip 15 may be made thin, thus the miniaturization of the semiconductor device 10 (specifically, reduction of a size in the thickness direction of the semiconductor device) may be attempted.

Embodiment 2

Figure 19:
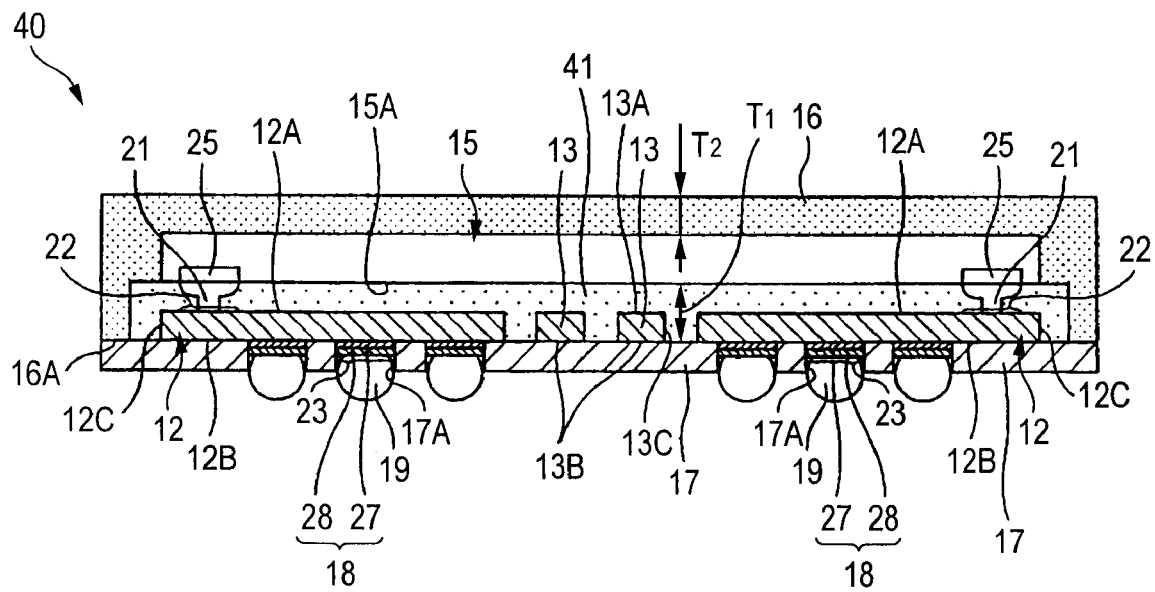
FIG. 19 is a cross-sectional view of a semiconductor device according to a second embodiment of the invention.

FIG. 19 is a cross-sectional view of a semiconductor device according to a second embodiment of the invention.

In FIG. 19, any constituents identical to those in the semiconductor device 10 of the first embodiment are indicated with identical reference numerals.

With reference to FIG. 19, the semiconductor device 40 of the second embodiment is configured in a similar manner as the semiconductor device 10 in the first embodiment except that it provides an anisotropic conductive resin 41 in the place of the insulating resin 11 provided in the semiconductor device 10.

As for the anisotropic conductive resin 41, an adhesive sheet-type anisotropic conductive resin (i.e. ACF (Anisotropic Conductive Film)) or a paste-type anisotropic conductive resin (i.e. ACP (Anisotropic Conductive Paste)) etc. may be used. ACP and ACF are ones including an epoxy resin-based insulating resin which contains small resin spheres covered by Ni/Au dispersed therein, and it is a resin which has conductivity in the vertical direction and insulation property in the horizontal direction.

When the paste-type anisotropic conductive resin (i.e. ACP (Anisotropic Conductive Paste)) is used as the anisotropic conductive resin 41, the paste-type anisotropic conductive resin is formed by a printing method, and then prebaking the paste-type anisotropic conductive resin to a semi-cured state. This semi-cured anisotropic conductive resin has a function as an adhesive.

Also in the case where such the anisotropic conductive resin 41 is used, it may be manufactured by a similar method as the semiconductor device 10 of the first embodiment, and may obtain similar effects as in the manufacturing method of the semiconductor device 20 of the first embodiment.

Furthermore, when manufacturing a semiconductor device 40 using the above-mentioned anisotropic conductive resin 41, the pressure to be applied when pressing the semiconductor chip may be smaller compared to the case where a typical insulating resin is used, so that the semiconductor device 40 may easily be manufactured.

Embodiment 3

Figure 20:
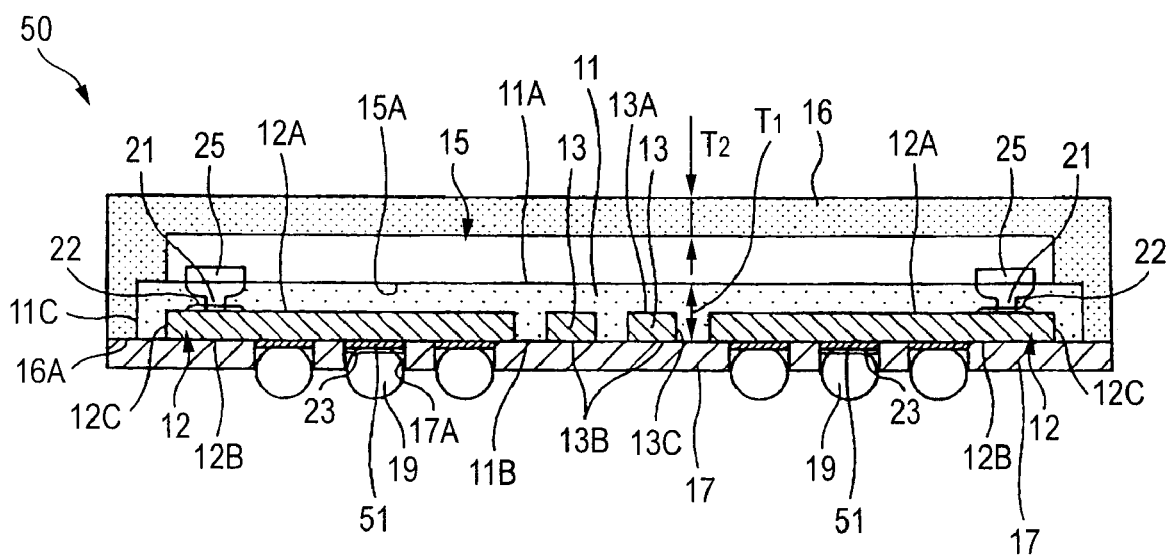
FIG. 20 is a cross-sectional view of a semiconductor device according to a third embodiment of the invention.
Figure 21:
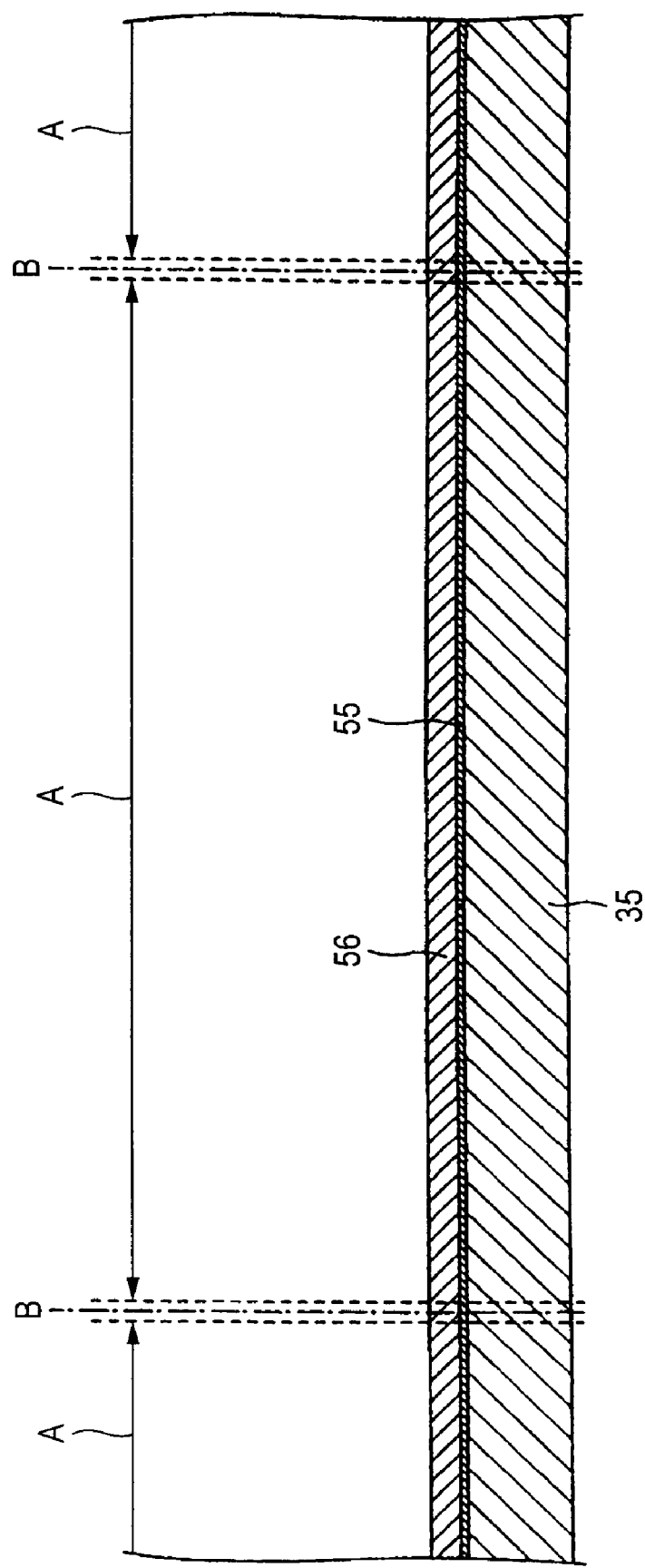
FIG. 21 shows a manufacturing process step (No. 1) of the semiconductor device according to the third embodiment of the invention.

FIG. 20 is a cross-sectional view of a semiconductor device according to a third embodiment of the invention. In FIG. 20, any constituents identical to those in the semiconductor device 10 of the first embodiment are indicated with identical reference numerals.

With reference to FIG. 20, the semiconductor device 50 of the third embodiment is configured in a similar manner as the semiconductor device 10 in the first embodiment except that it provides external connection terminal pads 51 in the place of the external connection terminal pads 18 provided in the semiconductor device 10.

The external connection terminal pads 51 are provided on portions of a bottom surface 12B of a wiring pattern 12 that correspond to pad formation regions 23. As for the external connection pads 51, an Sn film may for example be used.

The semiconductor device 50 of the third embodiment in this configuration can also obtain similar effects as the semiconductor device 10 of the first embodiment.

FIGS. 21 through 27 are views showing manufacturing steps of the semiconductor device according to the third embodiment of the invention. In FIGS. 21 through 27, any constituents identical to those in the semiconductor device 50 of the third embodiment shown in FIG. 20 are indicated with identical reference numerals.

With reference to FIGS. 21 through 27, the manufacturing method of the semiconductor device 50 of the third embodiment will be explained. First, in a process step shown in FIG. 21, a first metal layer 55 is formed so as to cover the metal plate 35 (FIG. 8) described according to the first embodiment, then a second metal layer 56 is formed so as to cover the first metal layer 55 (metal layer lamination process).

The first metal layer 55 works as an etching stopper for the etching of the second metal layer 56, as well as an etching stopper for the etching of the metal plate 35 for elimination. When Cu is used as a material of the metal plate 35 and the second metal layer 56, Sn, for example, may be used as a material of the first metal layer 55. The thickness of the first metal layer 55 may for example be 2 um. Also, the thickness of the second metal layer may for example be 10 um.

Figure 22:
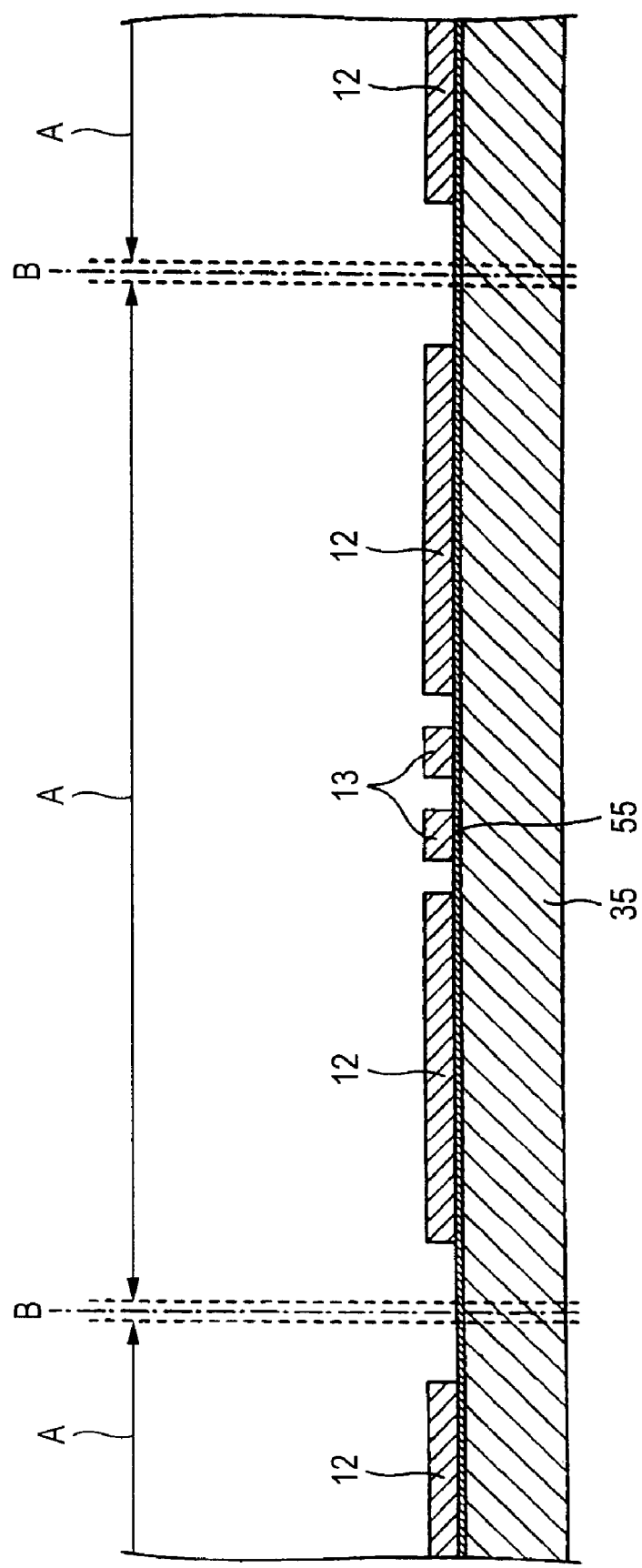
FIG. 22 shows a manufacturing process step (No. 2) of the semiconductor device according to the third embodiment of the invention.

Next, in a process step shown in FIG. 22, the second metal layer 56 is etched to form wiring patterns 12, 13 (wiring pattern formation process). More specifically, it is performed in a similar manner as the process shown in FIG. 10 explained according to the first embodiment.

At this point of time, since the first metal layer 55, as the etching stopper during etching of the second metal layer 56, is disposed between the second metal layer 56 and the metal plate 35, the metal plate 35 won't be etched while the second metal layer 56 is being etched, so that the precision in the thickness of the wiring patterns 12, 13 may be improved.

Figure 23:
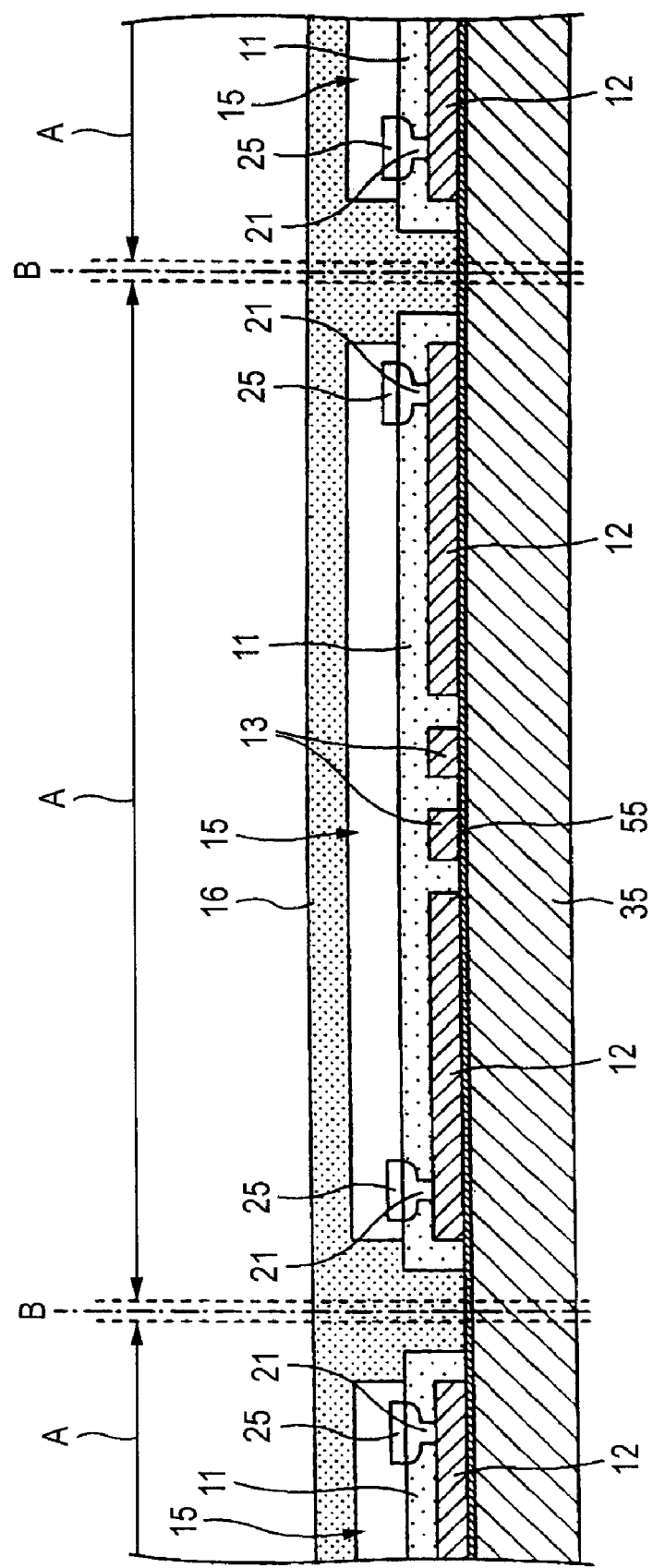
FIG. 23 shows a manufacturing process step (No. 3) of the semiconductor device according to the third embodiment of the invention.

Next, in a process step shown in FIG. 23, processes similar to those shown in FIGS. 11 through 13 explained in conjunction with the first embodiment are performed. More specifically, the semiconductor chip 15 is flip-chip bonded to the wiring pattern 12, and thereafter, the encapsulation resin 16 is formed over the first metal layer 55 so as to encapsulate the insulating resin 11 and the semiconductor device 15.

Figure 24:
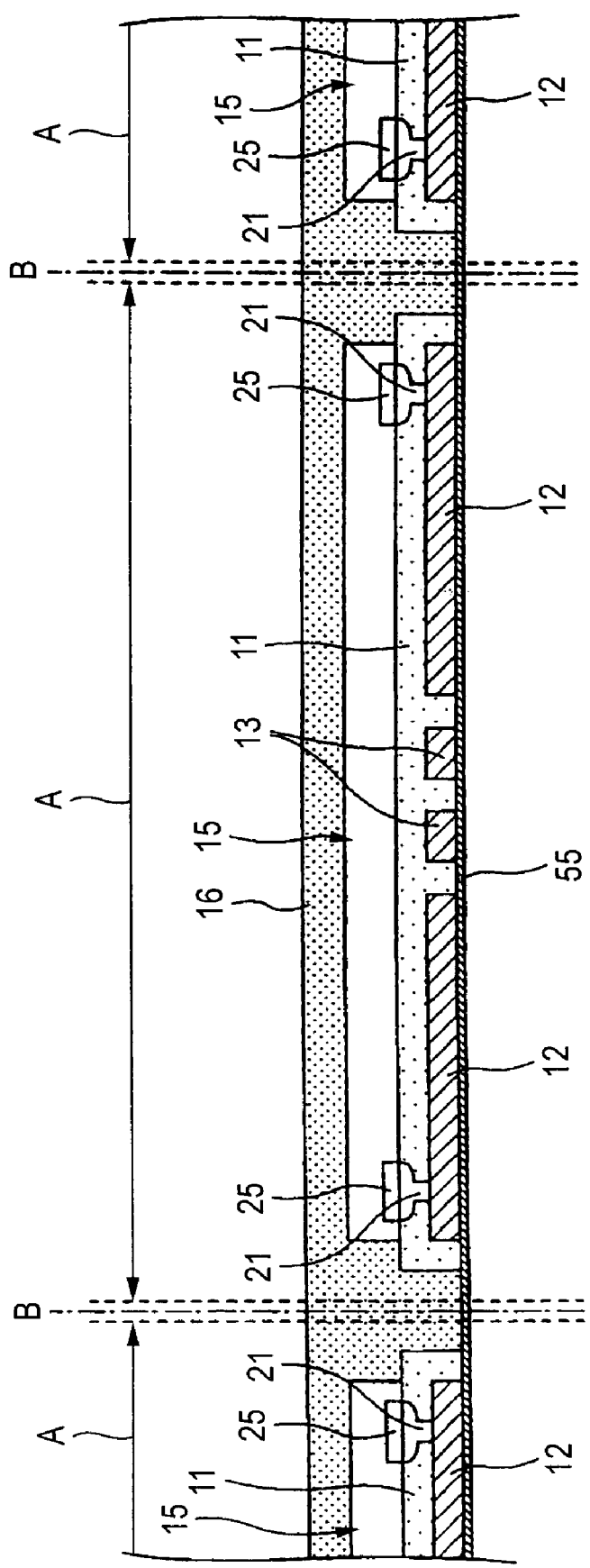
FIG. 24 shows a manufacturing process step (No. 4) of the semiconductor device according to the third embodiment of the invention.

Next, in a process step shown in FIG. 24, the metal plate 35 is eliminated through etching (metal plate elimination process). At this point of time, since the first metal layer 55, as the etching stopper during etching of the metal plate 35, is disposed between the second metal layer 35 and the metal plate 35, so that etching of the second metal layer 56 may be prevented while the metal plate 35 is being etched.

Figure 25:
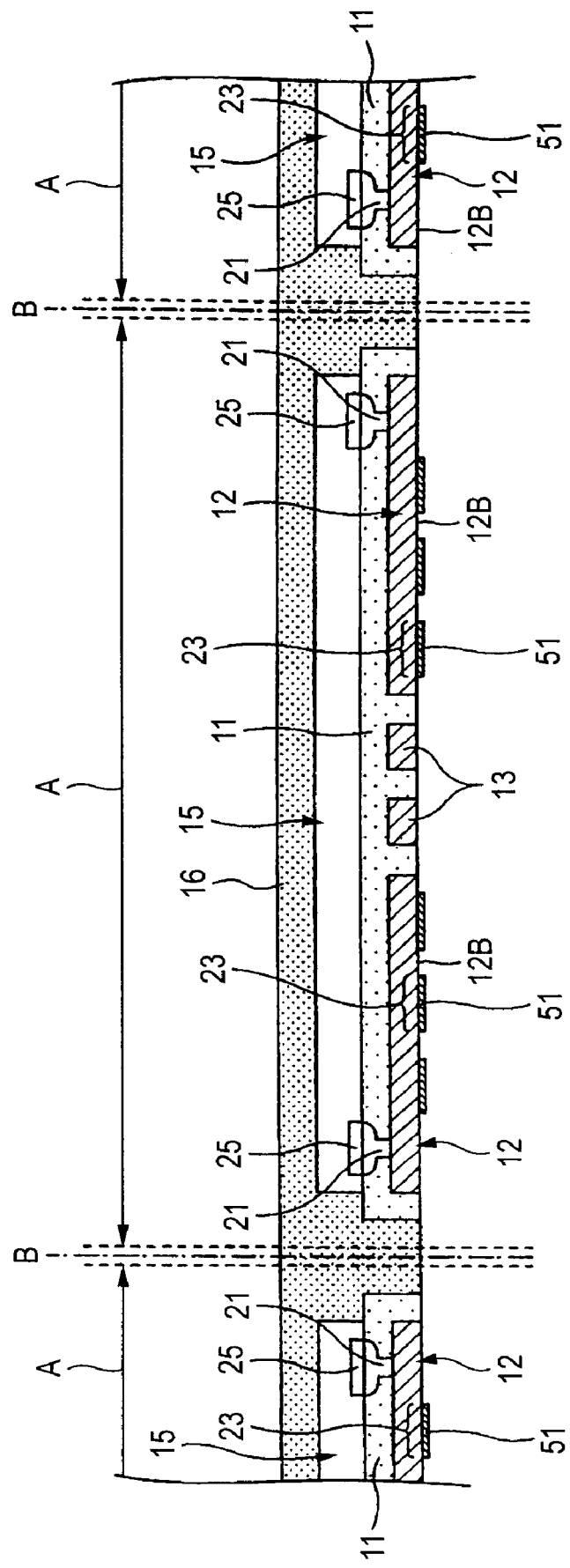
FIG. 25 shows a manufacturing process step (No. 5) of the semiconductor device according to the third embodiment of the invention.

Next, in a process step shown in FIG. 25, the first metal layer 55 is patterned to form external connection terminal pads 51 on the bottom side of the wiring pattern 12 (external connection terminal pad formation process). More specifically, a patterned resist film is formed on the bottom surface of the first metal layer 55 shown in FIG. 23, and then the first metal layer 55 is etched by anisotropic etching using this resist film as a mask to form the external connection terminal pads 51.

In this way, by forming the external connection terminal pads 51 by patterning the first metal layer 55, which worked as the etching stopper during etching of the second metal layer 56 and the metal plate 35, the manufacturing processes of the semiconductor device 50 may be simplified compared to a case where a separate metal layer for the formation of the external connection terminal pads 51 is provided.

Figure 26:
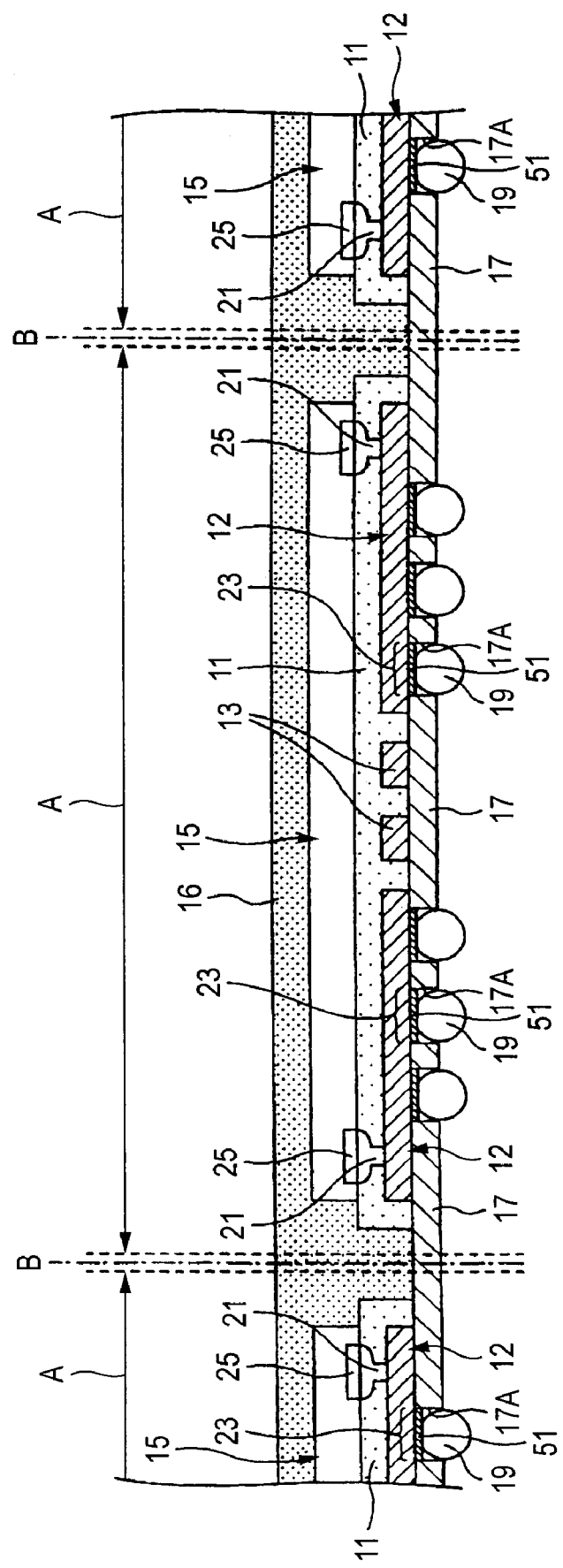
FIG. 26 shows a manufacturing process step (No. 6) of the semiconductor device according to the third embodiment of the invention.

Next, in a process step shown in FIG. 26, a solder mask 17 having openings 17A is formed on the bottom surface of the structure shown in FIG. 25 by a method similar to the process step shown in FIG. 15 explained in conjunction with the first embodiment, and thereafter, external connection terminals 19 are formed on the external connection terminal pads 51 by a method similar to the process step shown in 17 explained in conjunction with the first embodiment.

Figure 27:
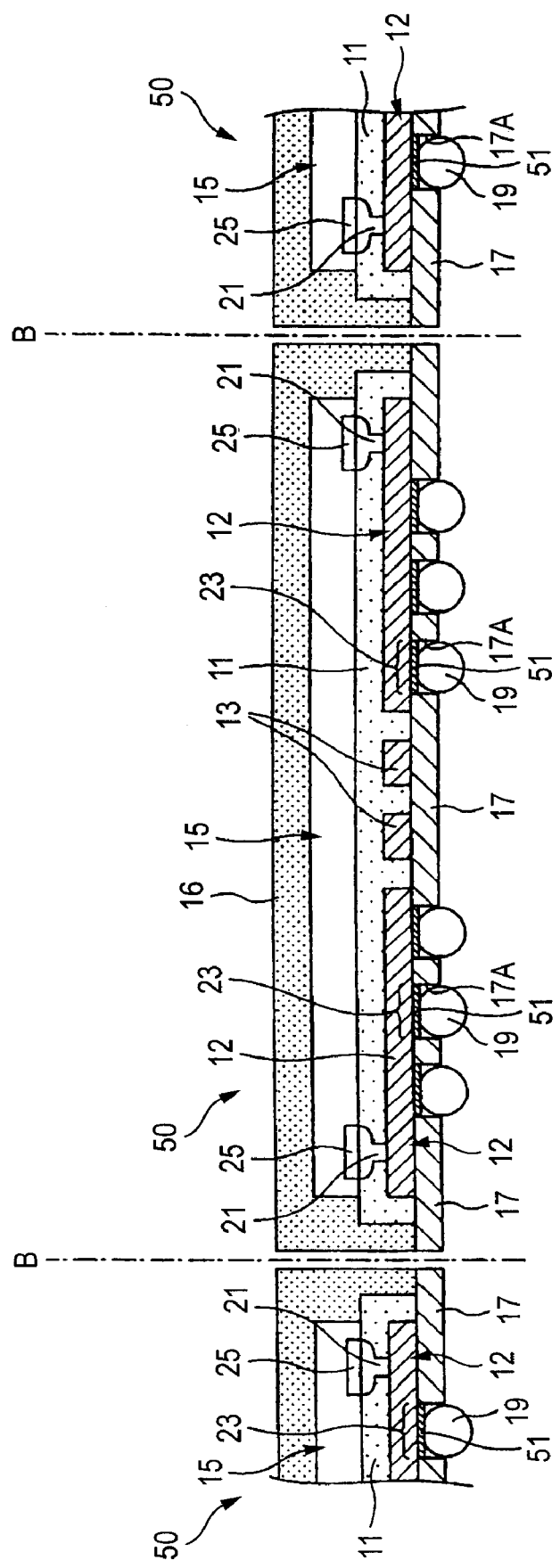
FIG. 27 shows a manufacturing process step (No. 7) of the semiconductor device according to the third embodiment of the invention.

Next, in a process step shown in FIG. 27, by cutting the encapsulation resin 16 by a dicer along the cutting positions B, a plurality of semiconductor devices 50 are completed.

According to the manufacturing method of a semiconductor device of the present embodiment, after forming the insulating resin 11 over the first metal layer 55 so as to cover the wiring patterns 12, 13, by pressing the semiconductor chip 15 against the insulating resin 11 to press-bond the internal connection terminals 21 and the wiring pattern 12 so as to flip-chip bond the semiconductor chip 15 to the wiring pattern 12, it is possible to reduce the thickness $T_2$ of the encapsulation resin 16 placed above the semiconductor chip 15, thus the miniaturization of the semiconductor device 50 (specifically, reduction of a size in the thickness direction of the semiconductor device 10) may be attempted.

Furthermore, by forming the external connection terminal pads 51 by patterning the first metal layer 55, which worked as the stopper when etching the second metal layer 56 and the metal plate 35, the manufacturing processes of the semiconductor device 50 may be simplified when compared to a case where a separate metal layer for the formation of the external connection terminal pads 51 is provided.

In the present embodiment, the semiconductor device 50 is explained as being manufactured using the insulating film 11, however, it is possible to manufacture the semiconductor device 50 using the anisotropic conductive resin 41 explained in conjunction with the second embodiment.

Although preferred embodiments of the invention are explained heretofore, the present invention is not limited to any of the particular embodiments disclosed, and various changes and modifications may be possible within the scope and spirit of the invention described in the claims.

The invention is applicable to a semiconductor device having a semiconductor chip encapsulated by an encapsulation resin and a manufacturing method thereof.

Further, the invention is applicable to a case that damps are located at the inner side of electrodes (fan-in) and a case that damps are located at the outer side of electrodes (fan-out).

What is claimed is:

1. A semiconductor device comprising:
   a semiconductor chip having an electrode pad,
   an external connection terminal pad electrically connected to the semiconductor chip,
   a wiring pattern,
   an insulating resin covering a first surface of the semiconductor chip, an upper surface of the wiring pattern, and a side surface of the wiring pattern,
   an encapsulation resin for encapsulating the semiconductor chip, and an upper surface and a side surface of the insulating resin, and
   a solder resist which is provided on a lower surface of the wiring pattern, a lower surface of the insulating resin, and a lower surface of the encapsulating resin and which is provided with an opening for exposing the external connection terminal pad, wherein
   the wiring pattern comprises: a chip connection region which is provided on an upper surface of the wiring pattern opposite to a first surface of the semiconductor chip on which the electrode pad is formed and to which the semiconductor chip is flip-chip bonded, and a pad formation region which is provided on a lower surface of the wiring pattern and on which the external connection terminal pad is formed.

2. The semiconductor device of claim 1, wherein external connection terminal pad includes a Ni film and an Au film.

3. The semiconductor device of claim 1, wherein an external connection terminal is provided on a bottom surface of the external connection terminal pad.

4. The semiconductor device of claim 1, wherein a thickness of the encapsulation resin formed over the semiconductor chip is between about 30 um and about 60 um.

5. The semiconductor device of claim 1, wherein a thickness of the insulating resin between the lower surface of the wiring pattern and the first surface of the semiconductor chip is about 20 um.

6. The semiconductor device of claim 1, further including an internal connection terminal provided in the insulating resin, the internal connection terminal being connected to the electrode pad at one end and to the wiring pattern at the other end.

* * * * *